United States Patent
Chen et al.

(10) Patent No.: US 10,862,435 B2
(45) Date of Patent: Dec. 8, 2020

(54) IMPEDANCE CIRCUIT AND BIAS CIRCUIT

(71) Applicant: RichWave Technology Corp., Taipei (TW)

(72) Inventors: Chih-Sheng Chen, Taipei (TW); Hung-Chia Lo, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 8 days.

(21) Appl. No.: 16/293,666

(22) Filed: Mar. 6, 2019

(65) Prior Publication Data
US 2020/0044613 A1    Feb. 6, 2020

(30) Foreign Application Priority Data

Aug. 2, 2018 (TW) .............................. 107126865 A

(51) Int. Cl.
*H03F 3/04* (2006.01)
*H03F 1/08* (2006.01)
*H03F 3/21* (2006.01)
*H03F 1/30* (2006.01)

(52) U.S. Cl.
CPC .............. *H03F 1/083* (2013.01); *H03F 1/30* (2013.01); *H03F 3/21* (2013.01); *H03F 2200/27* (2013.01); *H03F 2200/451* (2013.01)

(58) Field of Classification Search
CPC ... H03F 1/083; H03F 1/30; H03F 3/21; H03F 2200/451; H03F 2200/27; H03F 3/19; H03F 1/0261; H03F 1/302; H03F 2200/18; H03F 1/301; H03G 3/3042; H03G 3/3047

USPC .................................................. 330/285, 296
See application file for complete search history.

(56) References Cited

U.S. PATENT DOCUMENTS

| 5,903,178 A | 5/1999 | Miyatsuji |
| 7,504,677 B2 | 3/2009 | Glass |
| 8,378,749 B1 * | 2/2013 | Kim ...................... H03F 1/0266 330/261 |

(Continued)

FOREIGN PATENT DOCUMENTS

| TW | 200828782 | 7/2008 |
| TW | 201409941 A | 3/2014 |
| TW | 201824738 A | 7/2018 |

*Primary Examiner* — Khanh V Nguyen
(74) *Attorney, Agent, or Firm* — Winston Hsu

(57) ABSTRACT

An impedance circuit includes a first impedance terminal, a second impedance terminal, a first transistor, a second transistor, a low frequency signal blocking element, and a current-voltage transform circuit. The first transistor is coupled to the first impedance terminal, and controlled by a first voltage. The second transistor is coupled to the first impedance terminal, and controlled by a second voltage. The low frequency signal blocking element is coupled to the first transistor and the second impedance terminal. The current-voltage transform circuit is coupled to the first impedance terminal. The current-voltage transform circuit adjusts a terminal voltage at the first terminal of the current-voltage transform circuit according to a current flowing through the current-voltage transform circuit. The impedance circuit provides impedance between the first and the second impedance terminals according to the terminal voltage and the first voltage.

20 Claims, 3 Drawing Sheets

(56) References Cited

U.S. PATENT DOCUMENTS 8,736,376 B2 * 5/2014 Kim .................. H03F 1/304
330/285

* cited by examiner

IMPEDANCE CIRCUIT AND BIAS CIRCUIT

CROSS REFERENCE TO RELATED APPLICATION

This application claims priority of Taiwan application No. 107126865, which was filed on Aug. 2, 2018, and is included herein by reference.

TECHNICAL FIELD

The present invention is related to an impedance circuit, and more particularly, to an impedance circuit capable of compensating the manufacturing characteristic shift.

BACKGROUND

When using a power amplifier to amplify and transmit a radio frequency (RF) signal, to maintain the linearity of the power amplifier in the desired frequency band, and to provide sufficient power supply immediately when the output power changes, it is often necessary to provide the appropriate bias voltage and the corresponding impedance for the power amplifier. That is, in order to respond to changes in output power, the impedance in the bias circuit will also need to be correspondingly changed to maintain signal quality. Therefore, the designer has to design the required impedance circuit based on the structure and characteristics of the entire RF system with precise calculations.

However, during the manufacturing process, the circuit components located at different positions on the wafer may have characteristic variations in process parameters due to slight differences in environmental conditions or slight errors caused by the manufacturing equipment, such as variations in the concentration of the carrier. That is to say, the components fabricated on the same wafer may have different characteristics. For example, the transistor may be easier or more difficult to turn on than expected, that is, corresponding to different process corners. In this case, since the characteristics of the components in the circuit are shifted, the impedance induced during the actual operation may be different from the impedance predicted by the original calculation, resulting in the power amplifier being operated in an unexpected condition and reducing the transmission quality of the RF signal.

SUMMARY

One embodiment of the present invention discloses an impedance circuit. The impedance circuit includes a first impedance terminal, a second impedance terminal, a first transistor, a second transistor, a low frequency signal, and a current-voltage transform circuit.

The first transistor has a first terminal coupled to the first impedance terminal, a second terminal, and a control terminal for receiving a first voltage. The second transistor has a first terminal for receiving a first reference voltage, a second terminal coupled to the first impedance terminal, and a control terminal for receiving a second voltage. The low frequency signal blocking element has a first terminal coupled to the second terminal of the first transistor, and a second terminal coupled to the second impedance terminal. The current-voltage transform circuit has a first terminal coupled to the first impedance terminal, and a second terminal. The current-voltage transform circuit adjusts a terminal voltage at the first terminal of the current-voltage transform circuit according to a current flowing through the current-voltage transform circuit.

The impedance circuit provides an impedance between the first impedance terminal and the second impedance terminal according to the terminal voltage and the first voltage.

Another embodiment of the present invention discloses a bias circuit for providing a bias voltage for an amplifier on a radio frequency signal path. The bias circuit includes an impedance circuit and a third transistor.

The impedance circuit includes a first impedance terminal, a second impedance terminal, a first transistor, a second transistor, a low frequency signal, a current-voltage transform circuit, and a balance resistor.

The first transistor has a first terminal coupled to the first impedance terminal, a second terminal, and a control terminal for receiving a first voltage. The second transistor has a first terminal for receiving a first reference voltage, a second terminal coupled to the first impedance terminal, and a control terminal for receiving a second voltage. The low frequency signal blocking element has a first terminal coupled to the second terminal of the first transistor, and a second terminal coupled to the second impedance terminal. The current-voltage transform circuit has a first terminal coupled to the first impedance terminal, and a second terminal. The current-voltage transform circuit adjusts a terminal voltage at the first terminal of the current-voltage transform circuit according to a current flowing through the current-voltage transform circuit. The balance resistor has a first terminal coupled to the first terminal of the first transistor, and a second terminal coupled to the second terminal of the first transistor.

The third transistor has a first terminal for receiving a third reference voltage, a second terminal provides the bias voltage, and a control terminal coupled to the first impedance terminal.

DETAILED DESCRIPTION

Figure 1:
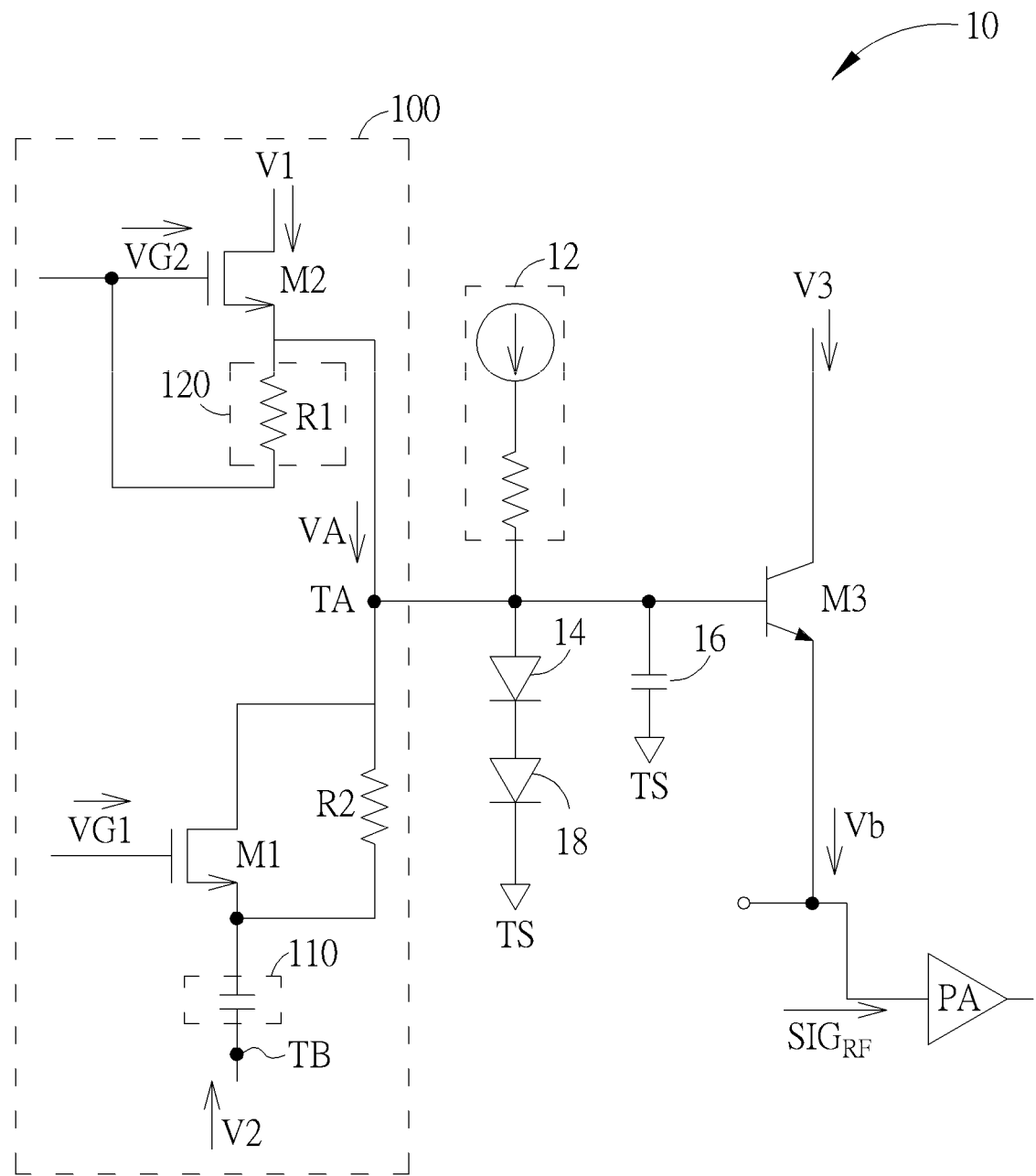
FIG. 1 shows a bias circuit according to one embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a bias circuit 10 according to one embodiment of the present invention. In FIG. 1, the bias circuit 10 is coupled to a power amplifier PA, and can provide a bias voltage Vb on the transmission path of the RF signal $SIG_{RF}$ to meet the operating condition required by the power amplifier PA. The power amplifier PA can amplify and output the RF signal $SIG_{RF}$.

The bias circuit 10 includes an impedance circuit 100. The impedance circuit 100 includes impedance terminals TA and TB, transistors M1 and M2, a low frequency signal blocking element 110 and a current-voltage transform circuit 120. The impedance circuit 100 can provide the impedance required by the system between the impedance terminal TA and the impedance terminal TB according to a voltage VG1 and a terminal voltage VA at a first terminal of the current-voltage transform circuit 120.

The transistor M1 has a first terminal coupled to the impedance terminal TA, a second terminal, and a control terminal for receiving the voltage VG1. The transistor M2 has a first terminal for receiving a reference voltage V1, a second terminal coupled to the impedance terminal TA, and a control terminal for receiving a second voltage VG2.

The low frequency signal blocking element 110 has a first terminal coupled to the second terminal of the transistor M1, and a second terminal coupled to the impedance terminal TB. In some embodiments of the present invention, the low frequency signal blocking element 110 can include a capacitor. Also, the impedance terminal TB can receive the reference voltage V2. In addition, the reference voltage V1 can be higher than the reference voltage V2. For example, the reference voltage V1 can be, for example but not limited to, the operational voltage in the system, while the reference voltage V2 can be, for example but not limited to, the ground voltage or the common voltage in the system.

In FIG. 1, the current-voltage transform circuit 120 has a first terminal coupled to the impedance terminal TA, and a second terminal coupled to the control terminal of the transistor M2. However, in some other embodiments, the second terminal of the current-voltage transform circuit 120 can also receive other appropriate voltages, such as the reference voltage V2. The current-voltage transform circuit 120 can adjust the terminal voltage VA at the first terminal of the current-voltage transform circuit 120 according to the current flowing through the current-voltage transform circuit 120.

Also, in FIG. 1, the bias circuit 10 can further include a transistor M3, a current source 12, at least one diode, such as diodes 14 and 18, and a capacitor 16. The third transistor M3 has a first terminal for receiving the reference voltage V3, a second terminal for providing the bias voltage Vb to the power amplifier PA, and a control terminal coupled to the impedance terminal TA.

The current source 12 can be coupled to the control terminal of the transistor M3 for providing the bias current. The diodes 14 and 18 can be coupled between the control terminal of the transistor M3 and the system voltage terminal TS for providing the direct-current bias voltage to the transistor M3. The capacitor 16 can be coupled between the control terminal of the transistor M3 and the system voltage terminal TS for providing the required matching impedance. The voltage at the system voltage terminal TS can be the same as the reference voltage V2. In some embodiments, the capacitor 16 and the impedance circuit 100 can provide the matching impedance required by the system together, for example, the impedance looking from the control terminal of the transistor M3 toward the impedance terminal TA.

In FIG. 1, the transistors M1 and M2 can be transistors of the same type. For example, the transistors M1 and M2 can both be N-type transistors, and can have similar characteristic shifts. In the present embodiment, the transistors M1 and M2 can both be depletion mode (D-mode) transistors, such as the D-mode pseudomorphic high electron mobility transistor (PHEMT). In some other embodiments, the transistors M1 and M2 may be P-type transistors. Generally, transistors M1 and M2 in the same circuit are manufactured with the same manufacturing process. Also, due to the proximity of the two transistors M1 and M2 in the circuit, the environmental conditions in the manufacturing process are usually very close, resulting in very similar characteristic shifts, for example, the variation between these two transistors may be within 5%. That is, the transistors M1 and M2 can be manufactured by the same process, and can be corresponding to the same process corner. For example, under the same temperature condition, the characteristic shift on the conductive resistor of the transistor M1 would be substantially the same as the characteristic shift on the conductive resistor of the transistor M2.

In this case, the impedance circuit 100 can compensate the characteristic shift of the transistor M1 according to the characteristic shift of the transistor M2, allowing the impedance circuits fabricated at different locations of the same wafer to be less susceptible to characteristic shifts of internal transistors and provide the impedances required by the system.

For example, if the transistors M1 and M2 are at the fast corner with fast switching speeds due to the characteristic shift, then when the same bias voltage is applied, comparing to transistors at the typical corner, the transistors M1 and M2 will have smaller turn-on resistances. In the impedance circuit 100, when the transistor M2 receives the voltage VG2, comparing the transistors at the typical corner, the transistor M2 can generate a greater current. In this case, the current-voltage transform circuit 120 will generate a greater voltage gap correspondingly, resulting in a higher terminal voltage VA at the first terminal of the current-voltage transform circuit (that is, the voltage at the impedance terminal TA will be higher).

In some embodiments of the present invention, the current-voltage transform circuit 120 can include a resistor R1. The resistor R1 can be coupled between the first terminal and the second terminal of the current-voltage transform circuit 120. Therefore, when the current flowing through the resistor R1 is greater, the voltage across the resistor R1 will also increase, raising the terminal voltage VA at the first terminal of the current-voltage transform circuit 120. If the voltage VG1 received by the control terminal of the transistor M1 remains unchanged, the gate-to-drain voltage of the transistor M1 will become greater (a negative voltage with a greater absolute value) due to the higher voltage at the first terminal of the transistor M1, resulting in greater turn-on resistance of the transistor M1. Consequently, the characteristic shift of the transistor M1 with smaller turn-on resistance can be compensated.

In contrast, if transistors M1 and M2 are at the slow corner with the slow switching speeds due to the characteristic shift, then when the same bias voltage is applied, comparing to transistors at the typical corner, the transistors M1 and M2 will have larger turn-on resistances. In the impedance circuit 100, when the transistor M2 receives the voltage VG2, comparing the transistors at the typical corner, the transistor M2 would generate a smaller current. In this case, the current-voltage transform circuit 120 will generate a smaller voltage gap correspondingly, resulting in a lower terminal voltage VA at the first terminal of the current-voltage transform circuit (that is, the voltage at the impedance terminal TA will be lower). In this case, the gate-to-drain voltage of the transistor M1 will decrease (a negative voltage with a smaller absolute value) due to the lower voltage at the first terminal of the transistor M1, resulting in smaller turn-on resistance of the transistor M1. Consequently, the characteristic shift of the transistor M1 with greater turn-on resistance can be compensated.

That is, regardless of the state of the characteristic shift of the transistors M1 and M2 in the impedance circuit 100, the impedance circuit 100 can provide very similar impedances between the impedance terminals TA and TB according to the same circuit design and the predetermined voltages VG1 and VG2. Since the impedance circuit 100 can compensate the characteristic shift itself, the yield rate of the products can be significantly improved.

In FIG. 1, the impedance circuit 100 can further include a balance resistor R2. The balance resistor R2 has a first terminal coupled to the first terminal of the transistor M1, and a second terminal coupled to the second terminal of the transistor M1. The balance resistor R2 can quickly pull the voltages at the first terminal and the second terminal of the transistor M1 to a close level when the impedance circuit 100 is activated, so as to facilitate the subsequent compensation operation. However, in some embodiments, if the practical operation condition of the system permits, the impedance circuit 100 can also omit the balance resistor R2.

In addition, in FIG. 1, the voltages VG1 and VG2 can be generated by constant voltage sources. However, in some embodiments of the present invention, the voltage VG1 can also be variable. In this case, by adjusting the voltage VG1 received by the control terminal of the transistor M1, the impedance required by the impedance circuit 100 can be adjusted. In addition, in some embodiments of the present invention, the impedance circuit 100 can also generate the voltage VG1 and VG2 by using a voltage division circuit.

Figure 2:
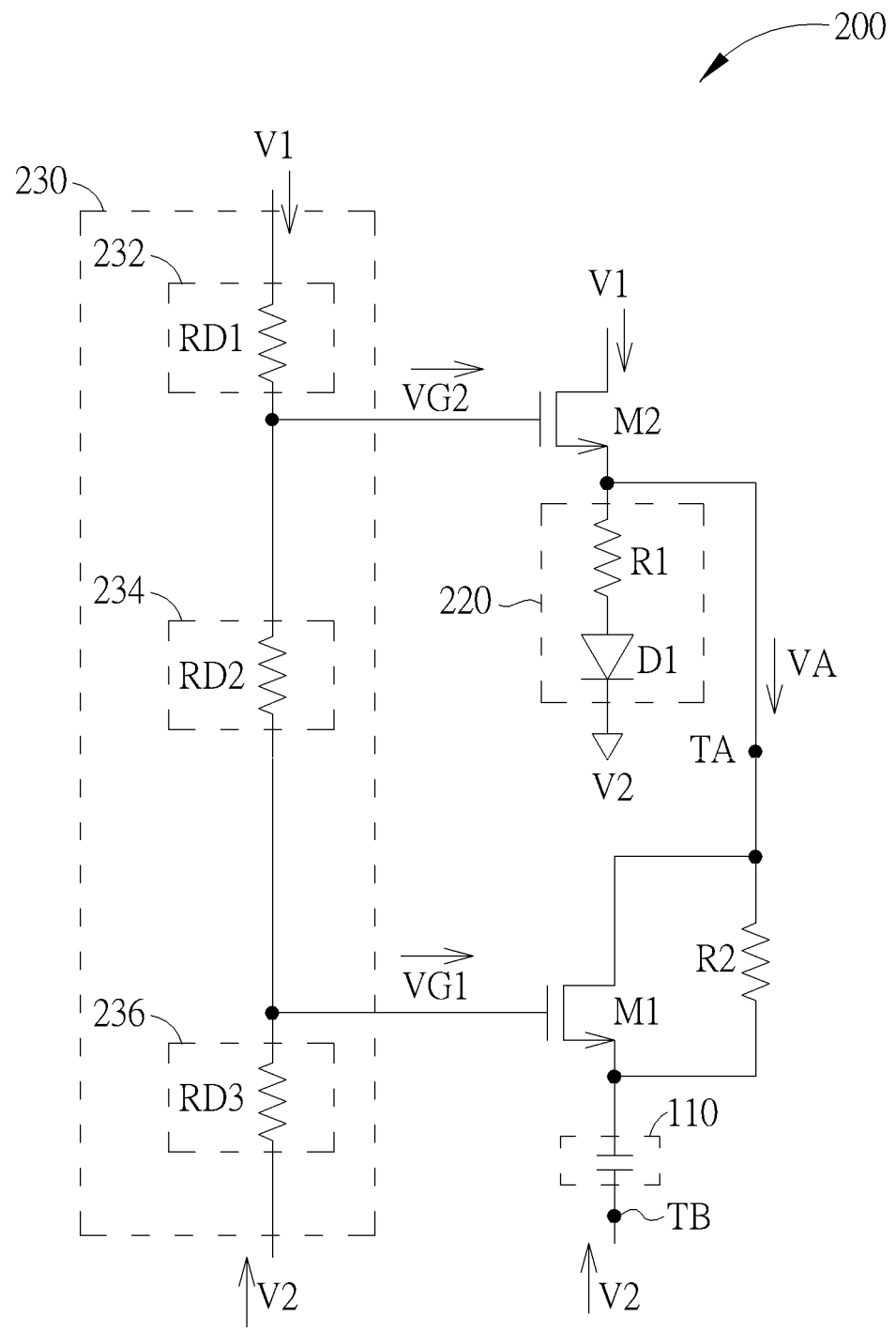
FIG. 2 shows an impedance circuit according to one embodiment of the present invention.

FIG. 2 shows an impedance circuit 200 according to one embodiment of the present invention. The impedance circuits 100 and 200 have similar structures, and can be operated by similar principles. In some embodiments, the impedance circuit 200 can replace the impedance circuit 100 and can be applied in the bias circuit 10. However, the impedance circuit 200 further includes a voltage division circuit 230 for providing the voltages VG1 and VG2, and the second terminal of the current-voltage transform circuit 220 can receive the reference voltage V2.

The voltage division circuit 230 can include voltage division elements 232, 234, and 236. The voltage division element 232 has a first terminal for receiving the reference voltage V1, and a second terminal for providing the voltage VG2. The voltage division element 234 has a first terminal coupled to the second terminal of the voltage division element 232, and a second terminal for providing the voltage VG1. The voltage division element 236 has a first terminal coupled to the second terminal of the voltage division element 234, and a second terminal for receiving the reference voltage V2. Since the two terminals of the voltage division element 232 can generate a first voltage gap, the two terminals of the voltage division element 234 can generate a second voltage gap, and the two terminals of the voltage division element 236 can generate a third voltage gap, the voltage division circuit 230 can provide the voltages VG1 and VG2 required by the impedance circuit 200 according to the voltage division elements 232, 234, and 236 between the reference voltages V1 and V2.

For example, the voltage division element 232 can include a voltage division resistor RD1, the voltage division element 234 can include a voltage division resistor RD2, and the voltage division element 236 can include a voltage division resistor RD3. In this case, by choosing the voltage division resistors RD1, RD2, and RD3 properly, the voltages VG1 and VG2 can be generated according to the resistance ratio of the voltage division resistors RD1, RD2, and RD3.

In addition, to reduce the voltage provided by the voltage dividing circuit 230 from being affected by the temperature change, the ratio of the first voltage gap across the voltage division element 232, the second voltage gap across the voltage division element 234, and the third voltage gap across the voltage division element 236 can remain substantially unchanged with temperature.

Generally, the turn-on resistance of the transistor M1 will increase when the temperature increases, and the turn-on resistance of the transistor M1 will decrease when the temperature decreases. To compensate the change of the turn-on resistance caused by temperature change, the current-voltage transform circuit 220 can further include a diode D1 in FIG. 2.

The diode D1 can be coupled in series with the resistor R1 between a first terminal and a second terminal of the current-voltage transform circuit 220. Generally, the turn-on voltage (or the barrier potential) of the diode D1 is more affected by temperature changes. For example, when the temperature increases, the turn-on voltage of the diode D1 will decrease. Also, when the temperature decreases, the turn-on voltage of the diode D1 will increase.

In this case, when the temperature is rather high, the voltage at the impedance terminal TA will be lowered as the turn-on voltage of the diode D1 decreases, reducing the gate-to-drain voltage on the transistor M1 so as to reduce the turn-on resistance of the transistor M1. Consequently, the turn-on resistance of the transistor M1 being increased under a high temperature environment can be compensated. Similarly, when the temperature is rather low, the voltage at the impedance terminal TA will be raised as the turn-on voltage of the diode D1 increases, increasing the gate-to-drain voltage on the transistor M1 so as to reduce the turn-on resistance of the transistor M1. Consequently, the turn-on resistance of the transistor M1 being decreased under a low temperature environment can be compensated.

That is to say, with the diode D1 in the current-voltage transform circuit 220, the impedance variation caused by temperature change can be compensated, increasing the resilience of the impedance circuit 200 to the environment. In some embodiments, instead of limiting the current-voltage transform circuit 220 to including only one diode, the designer can place a proper number of diodes in the current-voltage transform circuit 220 according to the characteristic of the transistor M1. Also, the diode D1 can be replaced by diode-connected transistors.

In addition to compensating the effects caused by temperature change through the current-to-voltage conversion circuit 220, the impedance circuit 200 can also compensate the effects caused by temperature change through the voltage division circuit in some other embodiments of the present invention.

Figure 3:
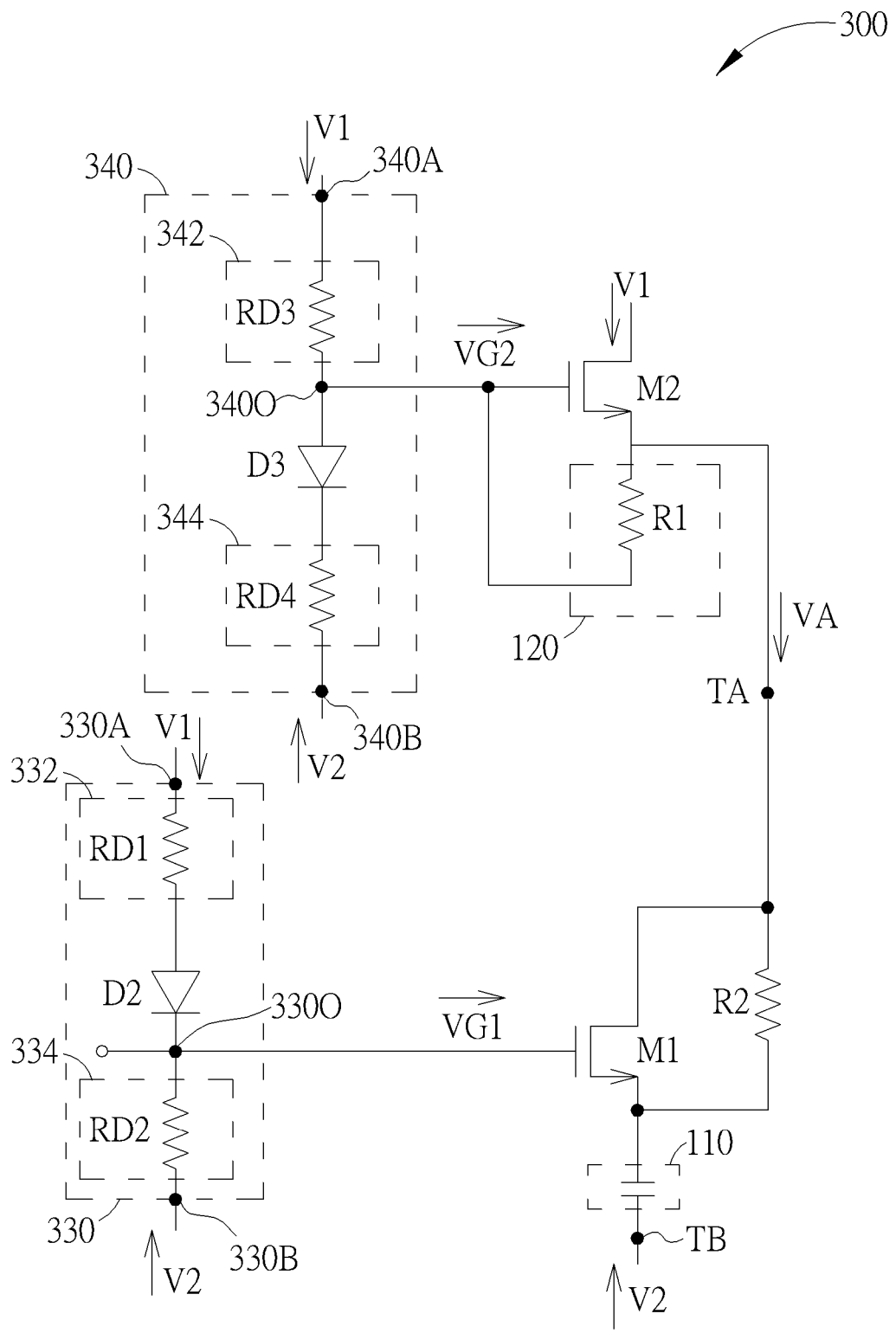
FIG. 3 shows an impedance circuit according to one embodiment of the present invention.

FIG. 3 shows an impedance circuit 300 according to one embodiment of the present invention. The impedance circuits 100 and 300 have similar structures and can be operated by similar principles. In some embodiments, the impedance circuit 300 can replace the impedance circuit 100 and can be applied in the bias circuit 10. However, the impedance circuit 300 can further include voltage division circuits 330 and 340. The voltage division circuit 330 can provide the voltage VG1 and the voltage division circuit 340 can provide the voltage VG2.

The voltage division circuit 330 includes an output terminal 330O, a voltage terminal 330A, a voltage terminal 330B, a voltage division element 332, and a voltage division element 334. The output terminal 330O of the voltage division circuit 330 can provide the voltage VG1. The voltage terminal 330A can receive the reference voltage V1, and the voltage terminal 330B can receive the reference voltage V2. The voltage division element 332 is coupled between the voltage terminal 330A of the voltage division circuit 330 and the output terminal 330O of the voltage division circuit 330. The voltage division element 334 has a first terminal coupled to the output terminal 330O of the voltage division circuit 330, and a second terminal coupled to the voltage terminal 330B of the voltage division circuit 330.

In FIG. 3, the voltage division element 332 can include a voltage division resistor RD1, and the voltage division element 334 can include a voltage division resistor RD2. The two terminals of the voltage division element 332 can generate a first voltage gap, and the two terminals of the voltage division element 334 can generate a second voltage gap. Since the voltage division elements 332 and 334 can provide the voltages mainly through the resistors, the ratio of the first voltage gap and the second voltage gap will not substantially change with temperature, reducing the effects on the voltages provided by the voltage division circuit 330 caused by temperature change.

However, to compensate the change in the turn-on resistance of the transistor M1 caused by the temperature change, the voltage division circuit 330 can further include at least one diode D2. The diode D2 and the voltage division element 332 can be coupled in series between the voltage terminal 330A and the output terminal 330O of the voltage division circuit 330.

In this case, when the temperature is rather high, the voltage VG1 will be raised as the turn-on voltage of the diode D2 becomes lower, reducing the gate-to-drain voltage on the transistor M1, and further reducing the turn-on resistance of the transistor M1. Consequently, the turn-on resistance of the transistor M1 being increased under high temperature environment can be compensated.

In contrast, when the temperature is rather low, the voltage VG1 will be lowered as the turn-on voltage of the diode D2 becomes greater, increasing the gate-to-drain voltage on the transistor M1, and further increasing the turn-on resistance of the transistor M1. Consequently, the turn-on resistance of the transistor M1 being decreased under low temperature environment can be compensated.

That is to say, with the diode D2 in the current-voltage transform circuit 330, the impedance variation caused by temperature change can be compensated, increasing the resilience of the impedance circuit 300 to the environment. In some embodiments, the diode D2 can be replaced by a diode-connected transistor.

The voltage division circuit 340 includes an output terminal 340O, a voltage terminal 340A, a voltage terminal 340B, a voltage division element 342, and a voltage division element 344. The output terminal 340O of the voltage division circuit 340 can provide the voltage VG2. The voltage terminal 340A can receive the reference voltage V1, and the voltage terminal 340B can receive the reference voltage V2. The voltage division element 342 has a first terminal coupled to the voltage terminal 340A of the voltage division circuit 340, and a second terminal coupled to the output terminal 340O of the voltage division circuit 340. The voltage division element 344 has a first terminal coupled to the output terminal 340O of the voltage division circuit 340, and a second terminal coupled to the voltage terminal 340B of the voltage division circuit 340.

In FIG. 3, the voltage division element 342 can include a voltage division resistor RD3, and the voltage division element 344 can include a voltage division resistor RD4. The two terminals of the voltage division element 342 can generate a third voltage gap, and the two terminals of the voltage division element 344 can generate a fourth voltage gap. In the present embodiment, since the voltage division elements 342 and 344 can provide the voltages mainly through the resistors, the ratio of the third voltage gap and the fourth voltage gap will not substantially change with temperature, reducing the effects on the voltages provided by the voltage division circuit 340 caused by temperature change.

However, to compensate the change in the turn-on resistance of the transistor M1 caused by the temperature change, the voltage division circuit 340 can further include at least one diode D3. The diode D3 and the voltage division element 344 can be coupled in series between the output terminal 340O and the voltage terminal 340B of the voltage division circuit 340.

In this case, when the temperature is rather high, the voltage VG2 will be reduced as the turn-on voltage of the diode D3 becomes lower, reducing the terminal voltage VA and the gate-to-drain voltage on the transistor M1, and so as to reduce the turn-on resistance of the transistor M1. Consequently, the turn-on resistance of the transistor M1 being increased under high temperature environment can be compensated.

In contrast, when the temperature is rather low, the voltage VG2 will be raised as the turn-on voltage of the diode D3 becomes greater, increasing the terminal voltage VA and the gate-to-drain voltage on the transistor M1, and so as to increase the turn-on resistance of the transistor M1. Consequently, the turn-on resistance of the transistor M1 being decreased under low temperature environment can be compensated.

That is to say, with the diode D3 in the current-voltage transform circuit 340, the impedance variation caused by temperature change can be compensated, increasing the resilience of the impedance circuit 300 to the environment. In some embodiments, the diode D3 can be replaced by a diode-connected transistor.

Furthermore, in some embodiments of the present invention, the designer can adjust the number of the diodes properly according to the system requirement, and is not limited to placing diodes in both the voltage division circuits 330 and 340. That is, the designer may only place the diode D2 in the voltage division circuit 330, or only place the diode D3 in the voltage division circuit 340 according to the system requirement in some embodiments.

In summary, the impedance circuits and the bias circuits provided by the embodiments of the present invention can compensate the characteristic shift of the internal transistors caused during the manufacturing process by themselves, so the desired impedance can be provided with the uniform circuit design and the same voltage specification, improving the yield rate of the products. Also, the impedance circuits and the bias circuits provided by the embodiments of the present invention can also use the diode to compensate the impedance changed caused by temperature change, increasing the resilience of the impedance circuits and the bias circuits to the environment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An impedance circuit comprising:
   a first impedance terminal;
   a second impedance terminal;
   a first transistor having a first terminal coupled to the first impedance terminal, a second terminal, and a control terminal configured to receive a first voltage;

a second transistor having a first terminal configured to receive a first reference voltage, a second terminal coupled to the first impedance terminal, and a control terminal configured to receive a second voltage;

a low frequency signal blocking element having a first terminal coupled to the second terminal of the first transistor, and a second terminal coupled to the second impedance terminal; and a current-voltage transform circuit having a first terminal coupled to the first impedance terminal, and a second terminal, the current-voltage transform circuit being configured to adjust a terminal voltage at the first terminal of the current-voltage transform circuit according to a current flowing through the current-voltage transform circuit;

wherein the impedance circuit is configured to provide an impedance between the first impedance terminal and the second impedance terminal according to the terminal voltage and the first voltage.

2. The impedance circuit of claim 1, wherein the second impedance terminal is configured to receive a second reference voltage.

3. The impedance circuit of claim 1, wherein the first transistor and the second transistor have similar characteristic shifts.

4. The impedance circuit of claim 1, wherein the first transistor and the second transistor are of a same type.

5. The impedance circuit of claim 1, wherein the first voltage is variable for adjusting the impedance.

6. The impedance circuit of claim 1, wherein the second terminal of the current-voltage transform circuit is coupled to the control terminal of the second transistor.

7. The impedance circuit of claim 1, wherein the second terminal of the current-voltage transform circuit is configured to receive a second reference voltage.

8. The impedance circuit of claim 1, wherein the current-voltage transform circuit comprises a first resistor.

9. The impedance circuit of claim 8, wherein the current-voltage transform circuit further comprises a diode or a diode-connected transistor, coupled in series with the first resistor between the second terminal and the first terminal of the current-voltage transform circuit.

10. The impedance circuit of claim 1, further comprising a first voltage division circuit configured to provide the first voltage and the second voltage, wherein the first voltage division circuit comprises:
    a first voltage division element having a first terminal configured to receive the first reference voltage, and a second terminal configured to provide the second voltage;
    a second voltage division element having a first terminal coupled to the second terminal of the first voltage division element, and a second terminal configured to provide the first voltage; and
    a third voltage division element having a first terminal coupled to the second terminal of the second voltage division element, and a second terminal configured to receive the second reference voltage.

11. The impedance circuit of claim 10, wherein a ratio of a first voltage gap between the first terminal and the second terminal of the first voltage division element, a second voltage gap between the first terminal and the second terminal of the second voltage division element, and a third voltage gap between the first terminal and the second terminal of the third voltage division element does not substantially change with temperature.

12. The impedance circuit of claim 1, further comprising a first voltage division circuit configured to provide the first voltage, wherein the first voltage division circuit comprises:
    an output terminal configured to provide the first voltage;
    a first voltage terminal configured to receive the first reference voltage;
    a second voltage terminal configured to receive the second reference voltage;
    a first voltage division element coupled between the first voltage terminal of the first voltage division circuit and the output terminal of the first voltage division circuit; and
    a second voltage division element having a first terminal coupled to the output terminal of the first voltage division circuit, and a second terminal coupled to the second voltage terminal of the first voltage division circuit.

13. The impedance circuit of claim 12, wherein a ratio of a first voltage gap between the first terminal and the second terminal of the first voltage division element, and a second voltage gap between the first terminal and the second terminal of the second voltage division element does not substantially change with temperature.

14. The impedance circuit of claim 12, wherein the first voltage division circuit further comprises at least one diode or at least one diode-connected transistor coupled in series with the first voltage division element between the first voltage terminal and the output terminal of the first voltage division circuit.

15. The impedance circuit of claim 12, further comprising a second voltage division circuit configured to provide the second voltage, wherein the second voltage division circuit comprises:
    an output terminal configured to provide the second voltage;
    a first voltage terminal configured to receive the first reference voltage;
    a second voltage terminal configured to receive the second reference voltage;
    a third voltage division element having a first terminal coupled to the first voltage terminal of the second voltage division circuit, and a second terminal coupled to the output terminal of the second voltage division circuit; and
    a fourth voltage division element coupled between the output terminal of the second voltage division circuit and the second terminal of the second voltage division circuit.

16. The impedance circuit of claim 15, wherein a ratio of a third voltage gap between the first terminal and the second terminal of the third voltage division element, and a fourth voltage gap between the first terminal and the second terminal of the fourth voltage division element does not substantially change with temperature.

17. The impedance circuit of claim 15, wherein the second voltage division circuit further comprises at least one diode or at least one diode-connected transistor coupled in series with the fourth voltage division element of the second voltage division circuit between the output terminal and the second voltage terminal of the second voltage division circuit.

18. The impedance circuit of claim 1, further comprising a second resistor having a first terminal coupled to the first terminal of the first transistor, and a second terminal coupled to the second terminal of the first transistor.

19. A bias circuit configured to provide a bias voltage for an amplifier on a radio frequency signal path and comprising:
- an impedance circuit comprising:
  - a first impedance terminal;
  - a second impedance terminal;
  - a first transistor having a first terminal coupled to the first impedance terminal, a second terminal, and a control terminal configured to receive a first voltage;
  - a second transistor having a first terminal configured to receive a first reference voltage, a second terminal coupled to the first impedance terminal, and a control terminal configured to receive a second voltage;
  - a low frequency signal blocking element having a first terminal coupled to the second terminal of the first transistor, and a second terminal coupled to the second impedance terminal;
  - a current-voltage transform circuit having a first terminal coupled to the first impedance terminal, and a second terminal, the current-voltage transform circuit being configured to adjust a terminal voltage at the first terminal of the current-voltage transform circuit according to a current flowing through the current-voltage transform circuit; and
  - a balance resistor having a first terminal coupled to the first terminal of the first transistor, and a second terminal coupled to the second terminal of the first transistor; and
- a third transistor having a first terminal configured to receive a third reference voltage, a second terminal configured to provide the bias voltage, and a control terminal coupled to the first impedance terminal.

20. The bias circuit of claim 19 further comprising:
- a current source coupled to the control terminal of the third transistor;
- at least one diode coupled to the control terminal of the third transistor and a system voltage terminal; and
- a capacitor coupled to the control terminal of the third transistor and the system voltage terminal.

* * * * *